United States Patent [19]
Van Rijn

[11] Patent Number: 5,543,046
[45] Date of Patent: Aug. 6, 1996

[54] INORGANIC MEMBRANE FOR MICROFILTRATION, AND A PROCESS FOR PRODUCTION OF SUCH AN INORGANIC MEMBRANE

[76] Inventor: Cornelis J. M. Van Rijn, Gerard Doustraat 10, NL-1072 VP Amsterdam, Netherlands

[21] Appl. No.: 341,592

[22] PCT Filed: May 19, 1993

[86] PCT No.: PCT/EP93/01280

§ 371 Date: Jan. 17, 1995

§ 102(e) Date: Jan. 17, 1995

[87] PCT Pub. No.: WO93/23154

PCT Pub. Date: Nov. 25, 1993

[30] Foreign Application Priority Data

May 21, 1992 [NL] Netherlands ............................ 9200902

[51] Int. Cl.⁶ .................................................. B01D 71/04
[52] U.S. Cl. ................. 210/490; 210/500.25; 210/500.26
[58] Field of Search ............................... 210/490, 500.22, 210/500.25, 500.26; 264/22, 41

[56] References Cited

U.S. PATENT DOCUMENTS 3,794,174 2/1974 Booman et al. .
4,923,608 5/1990 Flottmann et al. ................ 210/500.25

FOREIGN PATENT DOCUMENTS 0144097 6/1985 European Pat. Off. .
0325752 8/1989 European Pat. Off. .
2336963 7/1977 France .
2596289 10/1987 France .
3524799 1/1987 Germany .

OTHER PUBLICATIONS

By P. Sioshansi, "Medical Applications of Ion Beam Processes", Nuclear Instruments & Methods in Physics Research, Feb. 1987, pp. 204–208.

Primary Examiner—Frank Spear
Attorney, Agent, or Firm—Young & Thompson

[57] ABSTRACT

The inorganic membrane consists of a macroporous inorganic support and an inorganic membrane layer. The membrane layer is formed through depositing an inorganic layer by "Chemical Vapour Deposition" or "sputtering" on the macroporous support, onto this inorganic layer a photo-lacquer layer is formed, this photo-lacquer layer being exposed to a regular mask pattern with the use of a suitable source, this lacquer layer being developed, and in the inorganic layer the mask pattern is etched by a suitable etchant, thus forming the membrane layer. The pattern of the membrane layer may be given any particular design, practically with a repetition rate in the range 0.1–10 µm. It is thus conceivable to separate not only particles according to their size, but also to their shape. The membrane layer can be deposited very thinly in comparison to the dimension of the pore size, enabling a large flux, a reduced clogging and a minimal damage to particles or cells.

8 Claims, 3 Drawing Sheets

5,543,046

INORGANIC MEMBRANE FOR MICROFILTRATION, AND A PROCESS FOR PRODUCTION OF SUCH AN INORGANIC MEMBRANE

FIELD OF THE INVENTION

The present invention relates to an inorganic membrane for microfiltration, that consists of a macroporous inorganic support and an inorganic membrane layer with pores having a pore size typically between 0.01 µm and 10 µm, which membrane layer is connected rigidly to the inorganic support. The invention relates also to a process for production of such an inorganic membrane.

BACKGROUND OF THE INVENTION

A membrane consisting of a macroporous support and a membrane layer is a composite membrane. The macroporous support contributes in here to the mechanical strength of the total membrane. Whenever the membrane layer with a high pore density is deposited relatively thin in comparison to the mean pore size on a relatively thick support, a membrane with a high flux is obtained. In case the inorganic membrane layer as well as the inorganic support is made of suitable ceramic materials then the membrane will be chemically highly inert and will operate well at elevated temperatures.

From EP-A-0-144 097 a composite ceramic membrane is known having the above-mentioned characteristics. This ceramic membrane has a membrane layer that is formed by coating a porous support with a thin film by immersion in a stable sol of colloidal metal oxide (g -AlOOH) particles and then drying and heating the support, thus forming a macroporous membrane layer of metal oxide particles.

Such known inorganic membranes may display mechanical faults, like little fractures and 'pinholes' with typical size 10 µm to 100 µm, which are relatively large in comparison to the mean pore size, typically 5 nm–5 µm, thus reducing the separating characteristics.

Another intrinsic disadvantage of these membranes is the relatively large thickness of the membrane layer in comparison to the mean pore size, resulting in reduced flux characteristics of the membrane. In said patent publication the thickness of the membrane layer ranges from 50 to 1000 times the mean pore size of the membrane layer.

SUMMARY OF THE INVENTION

The present invention has as an object to provide an inorganic membrane with improved separating and flux characteristics. An other object is to provide an inorganic membrane particularly useful for biomedical filtration, in particular in solutions with vulnerable cells. Therefore, according to the invention an inorganic membrane for microfiltration is proposed, wherein the membrane consists of an inorganic macroporous support having a mean pore size in the range of 0.25 µm–025 µm, and an inorganic membrane layer being deposited and connected rigidly to a flattened surface of the macroporous support by means of a deposition method, whereby the pores of the membrane layer are perforations shaped as shallow channels square to the membrane layers, and are formed with a diameter in the range of 0.05–5 µm by means of etching, said channels having a length at least smaller than ten times the diameter of the channels.

Good filtration results are obtained according to the invention with an inorganic membrane consisting of a porous support of alumina with mean pore size in the range 0.25–25 µm and an inorganic membrane layer of silicon dioxide with channels of 0.05–5 µm. In preference the support and the membrane layer are constituted from equivalent materials with the same inorganic components. An inorganic membrane is thus obtained applicable in a broad temperature range with a good cohesion between the support and the membrane layer. Because of the low length/ diameter ratio of the channels an inorganic membrane with a high flux is obtained. In addition through this measure vulnerable cells have a minimum chance in being damaged during passing these channels.

The inorganic membrane may be produced by firstly depositing a suitable inorganic layer by chemical vapour deposition on the inorganic support, and secondly making perforations in this inorganic layer by means of a suitable etching process.

According to the invention an inorganic membrane is manufactured, in which the perforations in the membrane layer are made by means of a lithographic etching process, in particular UV lithography in combination with chemical etching. On the inorganic layer a photo-lacquer layer is formed, this photo-lacquer layer being exposed to the regular mask patten with the use of a suitable source, this photo-lacquer layer being developed, then in the inorganic layer the mash pattern is etched by a suitable wet or dry etchant, thus forming the membrane layer. The use of a lithographic etching process offers the advantage that the shape of the cross-section of the channels may be designed according to demand. Long shaped rectangular cross-section will lead to high flux.

The pattern of the membrane layer may be given any particular design, practically with a repetition rate in the range 0.1–10 µm. It is thus conceivable to separate not only particles according to their size, but also to their shape. This may be particularly useful for the separation of biological cells, e.g. yeast or blood cells.

Appropriate materials for the membrane layer of the membrane are according to the invention composed of ceramic constituents like silicon dioxide, silicon nitride, silicon carbide, alumina, zirconium oxides, titanium oxide and titanium nitride or other metal oxides, nitrides or silicides. Other materials like carbon, silicon, or metals like gold, silver, chromium, nickel, aluminum, titanium etc. are also appropriate. For biomedical microfiltration, e.g. separation of blood components, biocompatible or bloodcompatible materials may be used like titanium, titanium nitride, chromium alloys, carbon, silicon carbide, silicon, silicon nitride or other appropriate semiconducting materials and noble metals.

According to the invention a process for production of the inorganic membrane is proposed, the membrane consisting of a macroporous inorganic support and an inorganic membrane layer whereby an inorganic layer is deposited on a flattened surface of the support by means of chemical vapour deposition or sputtering, and whereby on the inorganic layer a photo-lacquer layer is formed, this photo-lacquer layer being exposed to a regular mask pattern with the use of a suitable source, this lacquer layer being developed, thereafter in the inorganic layer the mask pattern is etched by an etchant, forming perforations shaped as channels, square to the inorganic layer, thus forming the inorganic membrane layer. By depositing the flattening material on the porous support a reasonable uniform flat and dense surface is obtained. Useful deposition methods are vapour deposition, chemical vapour deposition, sputtering, sol/gel coating for small pores and spray coating, sol/gel coating, use of rubbing compounds, etc. for large pores. The inorganic layer deposited on a flat and dense surface will exhibit an almost featureless surface morphology, whilst the microstructure of an inorganic layer deposited directly, e.g. by means of chemical vapour deposition, on the porous support may consist of clusters of grains tightly packed together. A flat surface morphology of the inorganic layer is important in relation to the precision in which the channels may be formed by the subsequent lithographic etching. Materials like silicon and aluminum are suitable as a flattening material, especially polysilicon is well capable in filling pores. The flattening material should in a later stage of the process be removed from the pores in the support in order to obtain a permeable membrane. In preference the flattening material is removed by means of a material selective etchant that is brought into contact with the flattening material through the yet formed membrane layer. The selective etchant should mainly attack the flattening material and hardly the support material or the membrane layer.

Another preferential process in producing the membrane according to the invention is characterized in that subsequent to the deposit of the flattening material on the support a supplementing flattening process is being performed. The flattening process may be a mechanically polish method. The flattening process may also according to the invention be characterized in that on a surface of the flattening material firstly a thin lacquer layer is deposited, which lacquer layer will be hardened such that a very smooth surface is obtained. Secondly the hardened lacquer layer with a smooth surface is being etched, such that all lacquer layer will be removed, including part of the flattening material and the support, thus obtaining a very smooth and dense support surface with filled pores. The etching of the lacquer layer may be achieved by reactive ion (plasma) etching.

EP-A-0.325.752 discloses an inorganic membrane for microfiltration, wherein the membrane consists of a macroporous inorganic support and an inorganic membrane layer with pores having a pore size, typically between 0.01 µm and 10 µm, which membrane is connected rigidly to the inorganic support, whereby the pores of the membrane layer are perforations shaped as shallow channels, square to the membrane layer, in which the channels have a length and a diameter, such that the length is at least smaller than ten times the diameter of the channels. An intrinsic disadvantage of this membrane is the relative mechanical weakness of the membrane layer due to the deep orthogonal grid of grooves, being at least one half thickness of the membrane layer. Also the operation of the laser apparatus is very critical with respect to the thickness of the membrane layer, the material of the membrane layer, power intensity. Without a suitable mask pattern on the membrane layer the process of etching is very critical with respect to vibrations.

FR-A-2.596.289 describes a process for the production of a gas filtration membrane layer using a flattening material.

BRIEF DESCRIPTION OF THE DRAWINGS

The invention will now be explained by means of the accompanying drawing in which.

The figures are schematized and are not drawn to scale. Similar parts may have the same reference-mark.

DESCRIPTION OF THE PREFERRED EMBODIMENTS

Figure 1:
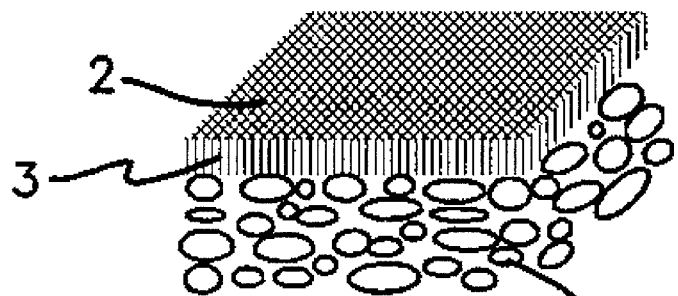
FIG. 1 shows in cross-section a part of the inorganic membrane according to the invention.

FIG. 1 shows schematic in cross-section a part of the inorganic membrane according to the invention. The inorganic membrane consists of a macroporous inorganic support 1, in this example a wafer of α-alumina with thickness 2.5 mm and mean pore size 5 µm and an inorganic membrane layer 2 of silicon dioxide with thickness 2 µm. The perforations in the membrane layer 2 are shaped as shallow channels 3, square to the membrane layer 2, in which the channels 3 have a length at least smaller than ten times the diameter of the channels 3. The channels 3 are formed here with a diameter of 1 µm in the membrane layer 2. The length of the channels 3 is here two times the diameter of the channels 3. The shape of the cross-section of the channels 3 is here circular.

Figure 2:
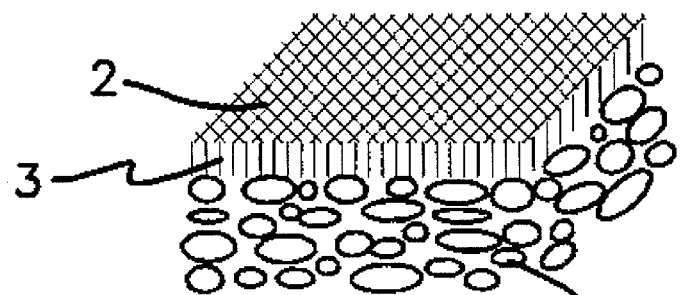
FIGS. 2 and 3 show in cross-section part of the inorganic membrane according to some preferential examples according to the invention.
Figure 3:
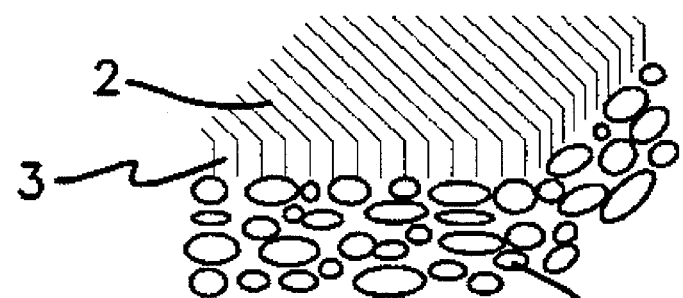
Figure 4:
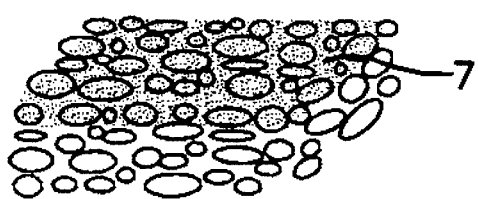
FIGS. 4 to 9 show in cross-section subsequent stages of a process for production of the inorganic membrane according to the invention.
Figure 5:
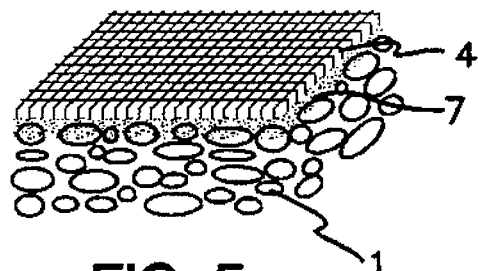
Figure 6:
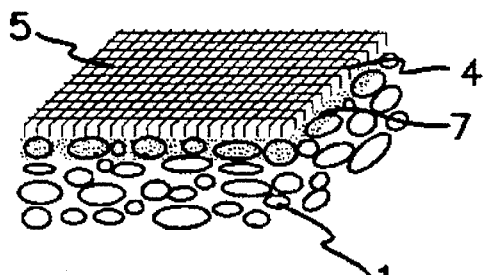
Figure 7:
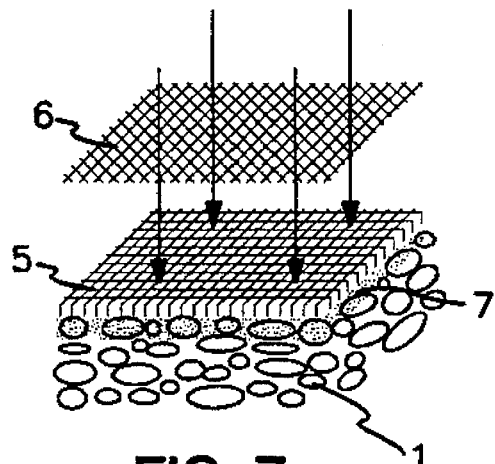
Figure 8:
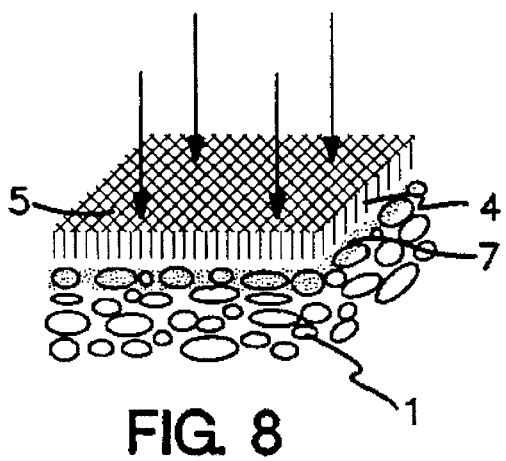

Depending on the application other shapes for the cross-section of the channels 3 may be chosen. For example rectangular shape, FIG. 2 or with line pattern shape, figure 3. Rectangular shape has the advantage that particles have difficulty in closing the channels totally. Line pattern shape of the membrane layer has the potential of a high flux. Circular of round shape of the cross-section has an advantage in separating media with vulnerable particles, in particular shallow channels with a rounded and smooth morphology are appropriate for separating biological cells.

Figure 9:
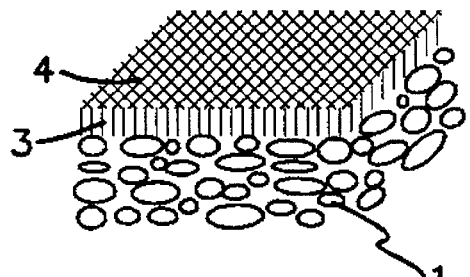
Figure 10A:
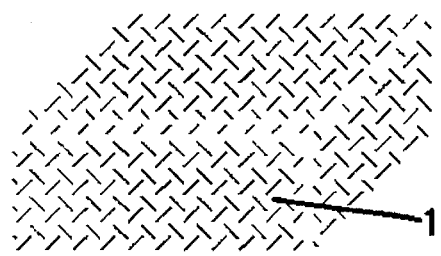
FIGS. 10a, 10b and 11 to 16 show in cross-section subsequent stages of a preferential process for production of the inorganic membrane according to the invention.
Figure 10B:
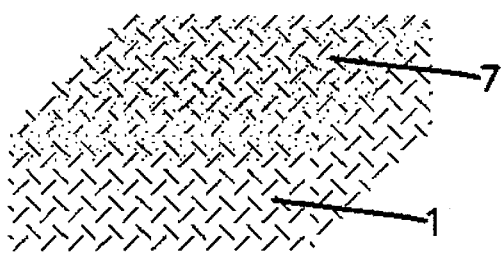
Figure 11:
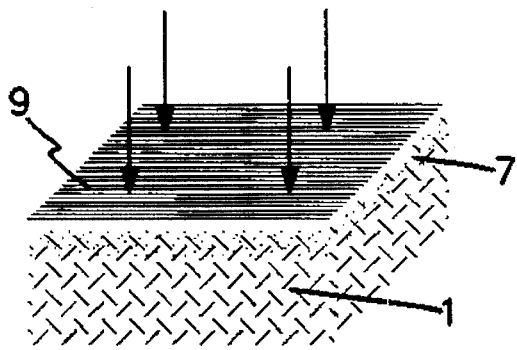
Figure 12:
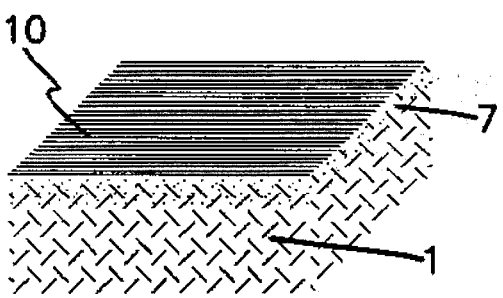

FIGS. 4 to 9 show in cross-section subsequent stages of a process for production of the inorganic membrane consisting of a macroporous inorganic support and an inorganic membrane layer according to the invention. Prior to the deposition of the inorganic layer 4 the pores lying at the surface of the inorganic support have been flattened and filled by rubbing for example a fine silicon power 7 on the surface, and if necessary followed by a light polishing method, FIG. 4. On the flattened surface of the inorganic support 1, FIG. 4, in this example a wafer of silicon carbide with thickness 2.5 mm and means pore size 15 µm, an inorganic layer 4 of silicon nitride with thickness 3 µm is deposited by means of a suitable deposition method, here by means of "Chemical Vapour Deposition", FIG. 5. The inorganic layer 4 is formed by chemical deposition of dichlorosilane and ammonia at low pressure (LPCVD). In the inorganic layer 4 then perforations are formed through the use of a lithographic determined etching process. On the inorganic layer 4 a photo-lacquer layer 5 is formed, FIG. 6, in this example Eastman Kodak Resist KPR-820. The photo-lacquer layer 5 is then being exposed to a regular pattern, FIG. 7, with the use of a suitable UV source, here with a Nikon NSR-1010i3 projection system and with the use of a mask 6 that is projected five times reduced. The pattern of the mask is made here of round fields with a diameter of 15 µm. Subsequently, the lacquer layer 5 is developed and etched leaving a reduced(5x) mask pattern of photo-lacquer 5 on the inorganic layer 4, FIG. 8, according to standard lithographic methods. In the inorganic layer 4 then the reduced mask pattern is etched by a suitable etchant, forming perforations with a diameter of 3 μm, herewith forming the inorganic membrane layer 4, FIGS. 8, 9. In this example the inorganic layer 4 of silicon nitride is etched by means of a stabilized fluoro-hydrogen (HF) solution. Perforations, shaped as shallow channels 3 with square cross-section are thus formed in the inorganic layer 4. Through these yet formed channels 3 the silicon power 7 is selectively etched with tetramethylammonium hydride. Finally all lacquer residues are removed and a clean inorganic membrane layer 4, FIG. 9, is obtained.

FIGS. 10a, 10b and 11 to 16 show in cross-section subsequent stages of a preferential process for production of the inorganic membrane according to the invention. Before the inorganic layer 4 is deposited on a surface of the support 1 primarily a suitable flattening material 7 is deposited on the surface of the support 1 filling all pores lying at the surface of the support, 1, FIG. 10b, The thickness of the flattening material 7 is related to the mean pore size of the porous support 1, in order to fill all pores lying at the surface of the support 1. In this example a porous support 1 of alumina with mean pore size 2 μm has as flattening material 7 a polysilicon layer with a thickness of about 5 82 m. The polysilicon layer 7 is deposited on the support by disintegration of silane (SiH4) at low pressure (LPCVD). Other materials like alumina with a well pore filling capability may also be used.

After the polysilicon deposition in preference a supplementing flattening process is performed. A mechanical polish with diamond powder will do very well. In preference according to the invention subsequent to the deposition of the flattening material 7 on the support 1 the flattening process is firstly performed by depositing on a surface of the flattening material 7 a thin lacquer layer 8, FIG. 11. For a thin, uniform and smooth lacquer surface 9 the method of 'spin-coating' may be employed. Next the lacquer layer 8 is hardened yielding a very smooth surface 9. Then the hardened lacquer layer 8 is etched, such that all lacquer layer 8 will be removed, including part of the flattening material 7 and the support 1, herewith obtaining a very smooth and dense support-surface 10 with filled pores, FIG. 12. The lacquer layer 8, the flattening material 7 and a part of the support 1 is well etched with a plasma containing tetrafluoromethane($CF_4$) and oxygen, resulting in a very smooth surface 10 with an overall surface roughness less than 0.1 μm.

Figure 13:
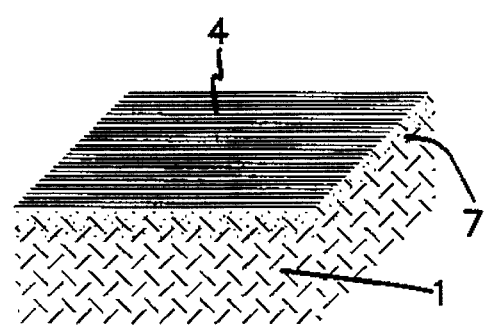
Figure 14:
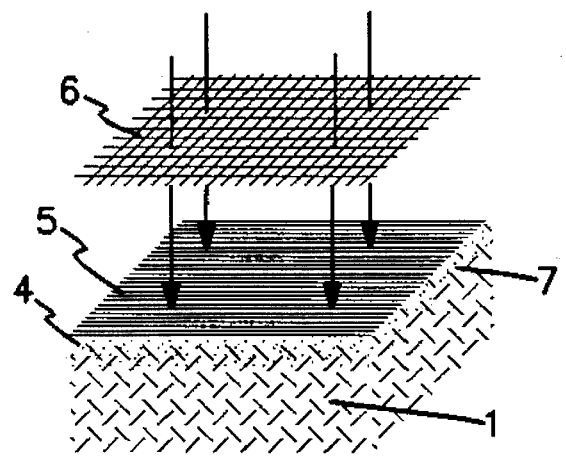
Figure 15:
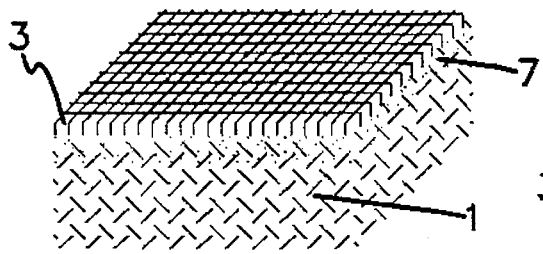
Figure 16:
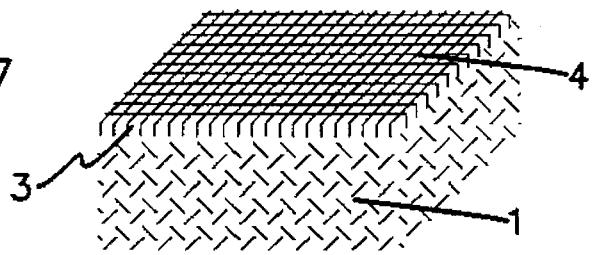

Next an inorganic layer 4 of silicon dioxide with thickness 1 μm is deposited by means of a suitable deposition method, here by disintegration of tetraethoxysilane, $(C_2H_5O)_4Si$, at low pressure (LPCVD). FIG. 13, on the smooth surface 10, resulting in an overall surface roughness less than 0.15 μm. On the inorganic layer 4 a photo-lacquer layer 5 is formed with a thickness of about 1 μm, FIG. 14, by means of 'spin-coating'. The photo-lacquer layer 5 is then exposed to a regular pattern with the use of a mask 6. The pattern of the mask is made here of square fields with a size of 1 to 1 μm. The focusing depth of the projection system used is here at least 1 μm, it should be larger than the sum of the thickness of the photo-lacquer layer and the surface roughness of the inorganic layer 4. Subsequently the lacquer layer 5 is developed and etched leaving a reduced(5×) mask pattern of photo-lacquer 5 on the inorganic layer 4, according to standard lithographic methods. In the inorganic layer 4 then the reduced mask pattern is etched by a suitable etchant, forming perforations with a square cross-section of 0.2 by 0.2 μm, herewith forming the inorganic membrane layer 4, FIG. 15. In this example the inorganic layer 4 of silicon dioxide is etched by means of a stabilized fluoro-hydrogen (HF) solution. The etching stops as soon as the surface 10 of the support has been reached. Excellent cylindrical perforations may also be etched by means of anisotropic reactive ion etching. Next the flattening material 7 is removed from the pores in the support 1 by means of a material selective etchant that is brought into contact with the flattening material 7 through the perforations of the yet formed inorganic membrane layer 4, FIGS. 15, 16. As a selective etchant, capable of etching very well polysilicon and hardly silicon dioxide or alumina a plasma may be used containing at least oxygen in an amount of 1–10% per mol and chlorine (Cl) in an amount of 25–30% per mol.

From the above it may be clear that the present invention is not limited to the mentioned examples, but that for the skilled specialist many variations of the invention will be possible. For instance, for the material of the inorganic membrane layer 4 other inorganic components like sodium oxide, potassium oxide, calcium oxide, magnesium oxide or silicon, gallium, arsenic, or other semiconductors and metals may be applied. The inorganic layer 4 or the support 1 may also be constituted from or coated with a biocompatible material. Other materials than polysilicon and aluminum are also possible for the use of a good flattening material 7, for example a low temperature liquifying glass layer. The use of the flattening material 7 for obtaining a flat and smooth surface may also be circumvented, for example through a partial liquification of the inorganic layer 4. Components may also be applied in enhancing the joining strength and temperature durability between the support 1 and the inorganic membrane layer 4, for example borax and diphosphorus pentoxide. The formed pattern in the lacquer layer 5 and subsequently in the membrane layer 4 is not limited to the use of an external mask, but may also be shaped by means of an interference pattern or with the use of a modulated laser beam. The invention is also not restricted to the use of optical lithography, other techniques with higher resolution (submicron), like Electron Beam and X-Ray Lithography are likewise appropriate.

I claim:

1. Inorganic membrane for microfiltration, comprising an inorganic macroporous support having a mean pore size in the range of 0.25 μm–25 μm, and an inorganic membrane layer deposited and connected rigidly to a flattened surface of the macroporous support by a deposition method, said pores of the membrane layer comprising perforations shaped as shallow channels square to the membrane layer, and being formed with a diameter in the range of 0.05–5 μm by etching, said channels having a length at least smaller than ten times the diameter of the channels.

2. Inorganic membrane according to claim 1, wherein the support is composed of a ceramic substance.

3. Inorganic membrane according to claim 2, wherein the membrane layer is also composed of a ceramic substance.

4. Inorganic membrane according to claim 1, wherein the inorganic membrane layer comprises a substance selected from the group consisting of silicon dioxide, silicon nitride, silicon carbide, alumina, zirconium oxide, titanium oxide, titanium nitride, gold, silver, chromium, cobalt, nickel, aluminum, titanium, chromium alloys, carbon and silicon.

5. Inorganic membrane according to claim 1, wherein the inorganic macroporous support comprises a substance selected from the group consisting of silicon dioxide, silicon nitride, silicon carbide, alumina, titanium nitride, titanium, carbon and silicon.

6. Process for production of an inorganic membrane for microfiltration, the membrane including a macroporous inorganic support and an inorganic membrane layer according to claim 1, said process comprising: depositing an inorganic layer on a flattened surface of the support by chemical vapour deposition or sputtering, forming on the inorganic layer a photo-lacquer layer, exposing said photo-lacquer layer to a regular mask pattern with the use of a suitable source, developing said lacquer layer, thereafter etching the mask pattern in the inorganic layer with an etchant, forming perforations shaped as channels, square to the inorganic layer, thereby forming the inorganic membrane layer.

7. Process according to claim 6, wherein before the inorganic layer is deposited on the flattened surface of the support, a flattening material is deposited on a surface of the support, filling all pores lying at the surface of the support, whereby said flattening material will at least be partially removed after the forming of the inorganic membrane layer.

8. Process according to claim 7, wherein the flattening material is selected from the group consisting of polysilicon, silicon and aluminum.

* * * * *